US012736591B2

(12) United States Patent
Kim et al.

(10) Patent No.: US 12,736,591 B2
(45) Date of Patent: Sep. 15, 2026

(54) SYSTEM FOR COMMUNICATION BETWEEN MASTER AND SLAVE IN SUPERCAP SYSTEM AND METHOD PERFORMING THEREOF

(71) Applicant: SEOYON E-HWA CO., LTD., Anyang (KR)

(72) Inventors: Sung Jin Kim, Sejong (KR); Tae Gyung Kim, Seongnam (KR)

(73) Assignee: Seoyon E-hwa Co., Ltd., Anyang (KR)

( * ) Notice: Subject to any disclaimer, the term of this patent is extended or adjusted under 35 U.S.C. 154(b) by 421 days.

(21) Appl. No.: 18/498,041

(22) Filed: Oct. 31, 2023

(65) Prior Publication Data

US 2024/0142540 A1 May 2, 2024

(30) Foreign Application Priority Data

Oct. 31, 2022 (KR) ........................ 10-2022-0142160

(51) Int. Cl.
*G01R 31/396* (2019.01)
*B60L 58/10* (2019.01)
*G01R 31/36* (2020.01)
*G01R 31/3835* (2019.01)

(52) U.S. Cl.
CPC ............ *G01R 31/396* (2019.01); *B60L 58/10* (2019.02); *G01R 31/3648* (2013.01); *G01R 31/3835* (2019.01)

(58) Field of Classification Search
CPC .... G01R 31/396; G01R 31/3648; B60L 58/10
See application file for complete search history.

(56) References Cited

U.S. PATENT DOCUMENTS

2008/0309513 A1 12/2008 Ebbe
2009/0083464 A1 3/2009 Beckhoff
2016/0226263 A1* 8/2016 Seo ........................... B60L 3/12
2017/0047759 A1* 2/2017 Kim .......................... H02J 7/64
2019/0265304 A1* 8/2019 Kim ........................ B60L 50/50
2019/0356143 A1* 11/2019 Lee ................... H01M 10/4285
2019/0361075 A1* 11/2019 Lee ................... H01M 10/4207

FOREIGN PATENT DOCUMENTS

JP 2019024307 A 2/2019
KR 20170056061 A 5/2017
KR 20210070111 A 6/2021

OTHER PUBLICATIONS

Office Action From Indian Patent Office Dated Feb. 13, 2026 Issued for Corresponding Indian Patent Application.

* cited by examiner

*Primary Examiner* — Ricky Go
(74) *Attorney, Agent, or Firm* — Harvest IP Law, LLP

(57) ABSTRACT

A system for communication between a master and a slave in a supercap system according to the present invention includes a plurality of slave units that are connected to each other in series, generate sensing data, and provide the sensing data to the slave units connected in series, and a master unit that is connected to a last slave unit among the plurality of slave units and receives the sensing data sensed by each of the plurality of slave units from the last slave unit.

8 Claims, 4 Drawing Sheets

100_1
100_2
100_3
200
SERIAL CONNECTION
SERIAL CONNECTION
GENERATE FIRST SENSING DATA (S305)
PROVIDE FIRST SENSING DATA (S310)
GENERATE SECOND SENSING DATA (S315)
PROVIDE FIRST AND SECOND SENSING DATA (S320)
GENERATE THIRD SENSING DATA (S325)
PROVIDE FIRST, SECOND, AND THIRD SENSING DATA (S330)
DETERMINE WHETHER THERE IS ABNORMALITY USING FIRST, SECOND, AND THIRD SENSING DATA(S335)

SYSTEM FOR COMMUNICATION BETWEEN MASTER AND SLAVE IN SUPERCAP SYSTEM AND METHOD PERFORMING THEREOF

BACKGROUND

1. Field of the Invention

The present invention relates to a system for communication between a master and a slave in a supercap system and a method of performing the same, and more particularly, to a system for communication between a master and a slave in a supercap system, which is capable of allowing a last slave unit connected to a master unit among a plurality of slave units connected in series to collect sensing data from the other slave units and transmit the collected sensing data to the master unit, and a method of performing the same.

2. Discussion of Related Art

Generally, when a vehicle battery is discharged, the vehicle battery is supplied with electricity from another vehicle or a new battery using a jump cable to start the discharged vehicle battery and drive a generator, thereby charging the battery.

The vehicle battery is charged by the generator (alternator) connected to a vehicle engine and supplies power to drive a starting motor that starts the vehicle. However, when the vehicle battery is not charged with electricity, the vehicle engine is not driven, and when the engine is not driven, the generator may not be driven, and the battery is not recharged.

When the battery is fully discharged, the battery is supplied with electricity from another vehicle or a new battery using the jump cable to start the vehicle and drive the generator, thereby charging the battery.

In addition, currently, among products of automobile insurance companies in Korea, an emergency roadside service may help overcome the above difficulties. However, this is frustrating for modern people who value their time.

In general, super capacitors are receiving much attention as next-generation energy storage devices, and research is being conducted on practical use and commercialization of systems using super capacitors as main or auxiliary energy storage devices.

In the case of electric vehicle systems that use supercaps as auxiliary energy storage devices among the many application fields of supercaps, supercaps are responsible for instantaneous energy supply and demand, which is evaluated as a very reasonable way to extend the life of a battery and increase the efficiency of an electric energy system.

SUMMARY OF THE INVENTION

The present invention provides a system for communication between a master and a slave in a supercap system, which is capable of allowing a last slave unit connected to a master unit among a plurality of slave units connected in series to collect sensing data from the other slave units and transmit the collected sensing data to the master unit, and a method of performing the same.

In addition, the present invention provides a system for communication between a master and a slave in a supercap system, which is capable of improving the problem of increased system weight due to an increase in the number of parts by connecting a plurality of slave units applied to a supercap system in series to simplify a communication connection circuit between a master unit and a slave unit, and a method of performing the same.

In addition, the present invention provides a system for communication between a master and a slave in a supercap system, which is capable of improving circuit connection stability by connecting a plurality of slave units applied to a supercap system in series and then connecting only a last slave unit to a master unit to simplify a connection circuit and minimize the number of components, and a method of performing the same.

Objects of the present invention are not limited to the above-described objects, and other objects and advantages of the present invention that are not described may be understood from the following description and will be more clearly appreciated from exemplary embodiments of the present invention. In addition, it may be easily appreciated that objects and advantages of the present invention may be realized by means described in the claims and combinations thereof.

According to an embodiment of the present disclosure, a system for communication between a master and a slave in a supercap system includes: a plurality of slave units that are connected to each other in series, generate sensing data, and provide the sensing data to the slave units connected in series; and a master unit that is connected to a last slave unit among the plurality of slave units and receives the sensing data sensed by each of the plurality of slave units from the last slave unit.

The plurality of slave units may include: a first slave unit that generates and provides first sensing data; and a second slave unit that generates second sensing data, and then provides the first sensing data received from the first slave unit and the second sensing data.

When the second slave unit is connected to the master unit, the second slave unit may provide the first sensing data and the second sensing data to the master unit.

The master unit may receive voltage sensing data of each of the plurality of slave units received from the last slave unit, generate a voltage balancing control signal using the voltage sensing data of each of the plurality of slave units, and provide the control balancing control signal to each of the plurality of slave units connected in series through the last slave unit.

The master unit may receive temperature sensing data of each of the plurality of slave units received from the last slave unit, use the temperature sensing data of each of the plurality of slave units to generate a charge/discharge blocking control signal to block charging/discharging of a corresponding cell, and provide the charge/discharge blocking control signal to each of the plurality of slave units connected in series through the last slave unit.

According to another embodiment of the present disclosure, a method of performing communication between a master and a slave in a supercap system includes: generating, by a first slave unit among a plurality of slave units connected to each other in series, first sensing data, and then providing the first sensing data to a second slave unit; receiving, by the second slave unit, the first sensing data from the first slave unit, generating second sensing data, and then providing the first sensing data and the second sensing data to a third slave unit; when the third slave unit is connected to a master unit, generating, by the third slave unit, third sensing data, and then transmitting the first sensing data, the second sensing data, and the third sensing data to the master unit; and monitoring, by the master unit, a battery using the first sensing data, the second sensing data, and the third sensing data from the third slave unit.

The monitoring, by the master unit, of the battery using the first sensing data, the second sensing data, and the third sensing data from the third slave unit may include: receiving, by the master unit, voltage sensing data of each of the plurality of slave units received from the last slave unit; generating a voltage balancing control signal using the voltage sensing data of each of the plurality of slave units; and providing the control balancing control signal to each of the plurality of slave units connected in series through the last slave unit.

The monitoring, by the master unit, of the battery using the first sensing data, the second sensing data, and the third sensing data from the third slave unit may include: receiving, by the master unit, temperature sensing data of each of the plurality of slave units received from the last slave unit; generating a charge/discharge blocking control signal to block charging and discharging of a corresponding cell using the temperature sensing data of each of the plurality of slave units; and providing the charge/discharge blocking control signal to each of the plurality of slave units connected in series through the last slave unit.

DETAILED DESCRIPTION OF EXEMPLARY EMBODIMENTS

Figure 1:
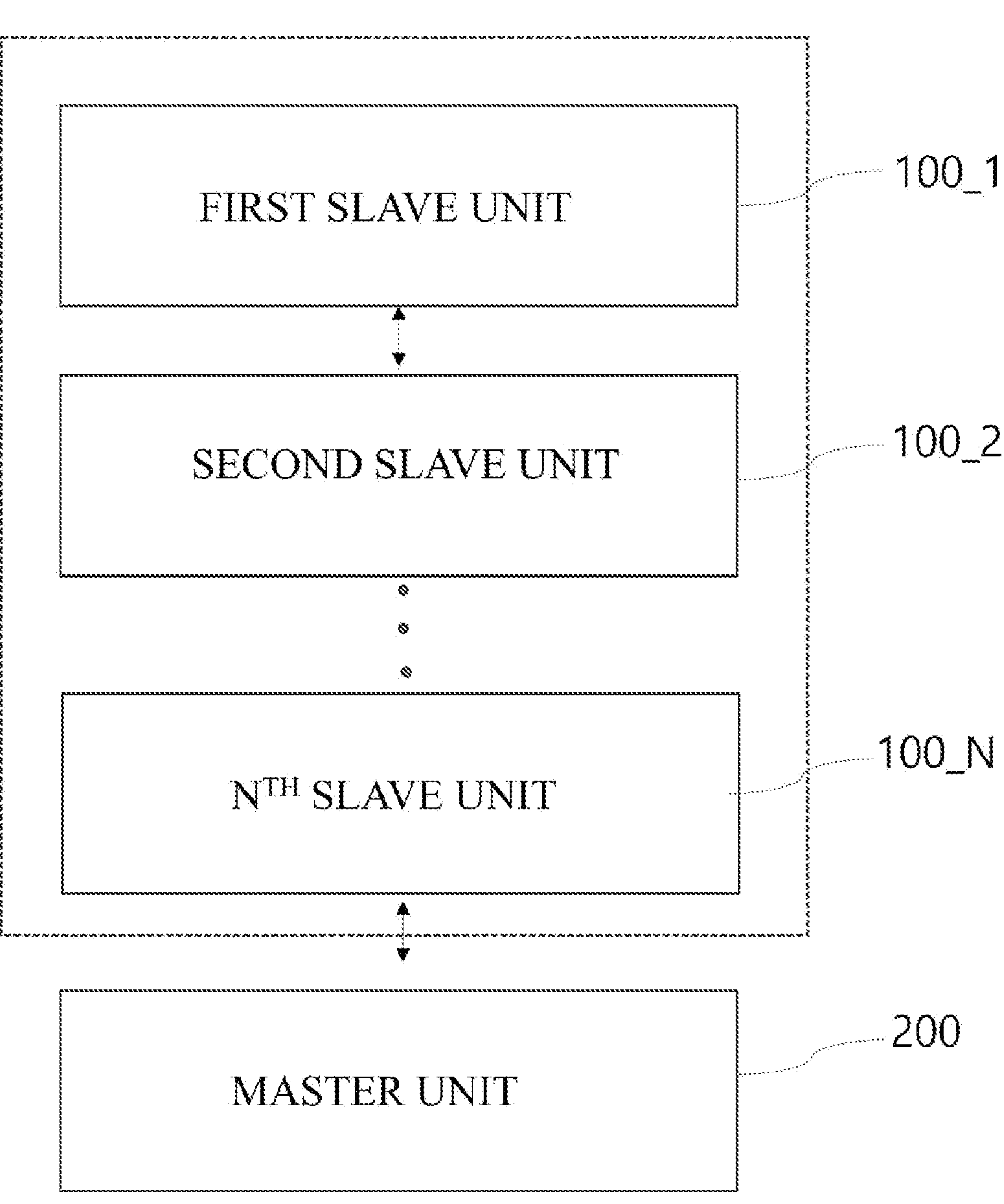
FIG. 1 is a diagram for describing a system for communication between a master and a slave in a supercap system according to an embodiment of the present invention.

The above-described objects, features, and advantages will be described below in detail with reference to the accompanying drawings, and accordingly, those skilled in the art to which the present invention pertains will be able to easily implement the technical idea of the present invention. When it is decided that detailed description of the known art related to the present invention may unnecessarily obscure the gist of the present invention, such detailed description will be omitted. Hereinafter, exemplary embodiments of the present invention will be described in detail with reference to the accompanying drawings. In the drawings, the same reference numerals are used to indicate the same or similar components.

FIG. 1 is a diagram for describing a system for communication between a master and a slave in a supercap system according to an embodiment of the present invention.

Referring to FIG. 1, a system for communication between a master and a slave in a supercap system includes a plurality of slave units 100_1 to 100_N and a master unit 200.

The plurality of slave units 100_1 to 100_N are connected to each other in series. The first slave unit 100_1 among the plurality of slave units 100_1 to 100_N generates first sensing data and provides the generated sensing data to the second slave unit 100_2 connected in series, and the second slave unit 100_2 generates second sensing data and provides the first sensing data received from the first slave unit 100_1 and the second sensing data to a third slave unit 100_3.

When the third slave unit 100_3 is the last unit among the plurality of slave units 100_1 to 100_N and is connected to the master unit 200, the third slave unit 100_3 generates the third sensing data and then provides the third sensing data along with the first and second sensing data from the second slave unit 100_2 to the master unit 200.

As described above, according to the present invention, the last slave unit connected to the master unit among the plurality of slave units connected in series collects sensing data from the other slave units and transmits the collected sensing data to the master unit, thereby improving the problem of increased system weight due to an increase in the number of parts by simplifying the communication connection circuit between the master unit and the slave unit.

The master unit 200 is connected to the last slave unit 100_N among the plurality of slave units 100_1 to 100_N, and receives the sensing data sensed by each of the plurality of slave units 100_1 to 100_N from the last slave unit 100_N. In this case, the sensing data includes voltage sensing data and temperature sensing data.

The master unit 200 monitors a battery using the sensing data sensed by each of the plurality of slave units 100_1 to 100_N received from the last slave unit 100_N.

The master unit 200 compares a voltage and a preset threshold voltage range using the voltage sensing data sensed by each of the plurality of slave units 100_1 to 100_N received from the last slave unit 100_N, generates a voltage balancing control signal according to the comparison result, and provides the generated voltage balancing control signal to each of the plurality of slave units 100_1 to 100_N through the last slave unit 100_N.

In an embodiment, when the voltage sensed by each of the plurality of slave units 100_1 to 100_N received from the last slave unit 100_N is not within the preset threshold voltage range, the master unit 200 may generate the voltage balancing control signal that is transmitted to the slave that generates the corresponding voltage sensing data.

In addition, when the master unit 200 receives the voltage sensing data sensed by each of the plurality of slave units 100_1 to 100_N, the master unit 200 displays each piece of the voltage sensing data in a first graph.

The master unit 200 divides the first graph into specific units and then groups the first graph to generate a plurality of groups.

In an embodiment, the master unit 200 divides the first graph into specific units and then groups the first graph to generate the plurality of groups.

In another embodiment, the master unit 200 analyzes the first graph, and when a waveform exists, divides and groups the first graph into cycle units to generate the plurality of groups.

Thereafter, the master unit 200 compresses voltage values of the corresponding groups for each of the plurality of groups.

In an embodiment, the master unit 200 divides the first graph into specific units and then groups the first graph to generate the plurality of groups, and averages the voltage values of the corresponding groups for each of the plurality of groups to calculate the average value.

In this case, the master unit 200 may divide the voltage values in the first graph into specific number units to generate the plurality of groups.

Thereafter, the master unit 200 compresses the voltage values of each of the plurality of groups and displays the compressed voltage values in a second graph, and then generates and provides the voltage balancing control signal according to whether a specific voltage value in the second graph corresponding to each group exists within the preset threshold voltage range.

In an embodiment, the master unit 200 averages the voltage values of each of the plurality of groups and displays the calculated average value in the second graph at a location corresponding to the group. In this case, the second graph averages a specific number of voltage values in the corresponding groups for each group and then displays a voltage value corresponding to the average value.

As described above, the master unit 200 may average the voltage values of the corresponding groups for each of the plurality of groups, display the averaged voltage values in the second graph and then analyze the second graph to extract the largest slope value, and then determine whether the largest slope value is within the preset threshold voltage range.

In an embodiment, the master unit 200 may compare slope values extracted from each group to calculate a slope difference value, merge the groups according to the slope difference value to extract only one slope value, and then determine whether the extracted slope value is within the preset threshold voltage range.

In the above embodiment, the master unit 200 may compare the slope values extracted from each of the first group and the second group to calculate the slope difference value, merge the first group and the second group when the slope difference value is less than or equal to a specific value, and then determine whether the larger slope value of the largest slope value extracted from the first group and the largest slope value extracted from the second group is within the preset threshold voltage range.

In the process of repeatedly executing the above process, when the number of merged groups exceeds the specific number, the merging is stopped. Therefore, the master unit 200 checks the number of currently merged groups before merging the first group and the second group, and when the number of merged groups is greater than or equal to the specific number, the master unit 200 does not perform the merging, but performs the merging when the number of merged groups is less than or equal to the specific number.

In addition, the master unit 200 compares temperature and a preset threshold voltage range using the temperature sensing data sensed by each of the plurality of slave units 100_1 to 100_N received from the last slave unit 100_N, and generates a cell charge/discharge blocking control signal according to the comparison result and provides the generated cell charge/discharge blocking control signal to each of the plurality of slave units 100_1 to 100_N through the last slave unit 100_N.

In an embodiment, when the temperature sensed by each of the plurality of slave units 100_1 to 100_N received from the last slave unit 100_N is not within the preset threshold temperature range, the master unit 200 may generate the cell charge/discharge blocking control signal that is transmitted to the slave that generates the corresponding temperature sensing data.

In addition, when the master unit 200 receives the temperature sensing data sensed by each of the plurality of slave units 100_1 to 100_N, the master unit 200 displays each piece of the temperature sensing data in a first graph.

The master unit 200 divides the first graph into specific units and then groups the first graph to generate a plurality of groups.

In an embodiment, the master unit 200 divides the first graph into specific units and then groups the first graph to generate a plurality of groups.

In another embodiment, the master unit 200 analyzes the first graph, and when a waveform exists, divides and groups the first graph into cycle units to generate the plurality of groups.

Thereafter, the master unit 200 compresses temperature values of the corresponding groups for each of the plurality of groups.

In an embodiment, the master unit 200 divides the first graph into specific units and then groups the first graph to generate the plurality of groups, and averages the temperature values of the corresponding groups for each of the plurality of groups to calculate the average value.

In this case, the master unit 200 may divide the temperature values in the first graph into specific number units to generate the plurality of groups.

Thereafter, the master unit 200 compresses the temperature values of each of the plurality of groups and displays the compressed voltage values in a second graph, and then generates and provides the cell charge/discharge blocking control signal according to whether a specific voltage value in the second graph corresponding to each group exists within the preset threshold voltage range.

In an embodiment, the master unit 200 averages the temperature values of each of the plurality of groups and displays the calculated average value in the second graph at a location corresponding to the group. In this case, the second graph averages a specific number of temperature values in the corresponding groups for each group and then displays the temperature value corresponding to the average value.

As described above, the master unit 200 may average the temperature values of the corresponding groups for each of the plurality of groups, display the averaged temperature value in the second graph and analyze the second graph to extract the largest slope value, and then determine whether the largest slope value is within the preset threshold voltage range.

In an embodiment, the master unit 200 may compare slope values extracted from each group to calculate a slope difference value, merge the groups according to the slope difference value to extract only one slope value, and then determine whether the extracted slope value is within the preset threshold voltage range.

In the above embodiment, the master unit 200 may compare the slope values extracted from each of the first group and the second group to calculate the slope difference value, merge the first group and the second group when the slope difference value is less than or equal to the specific value, and then determine whether the larger slope value of the largest slope value extracted from the first group and the largest slope value extracted from the second group is within the preset threshold temperature range.

In the process of repeatedly executing the above process, when the number of merged groups exceeds the specific number, the merging is stopped. Therefore, the master unit 200 checks the number of currently merged groups before merging the first group and the second group, and when the number of merged groups is greater than or equal to the specific number, the master unit 200 does not perform the merging, but performs the merging when the number of merged groups is less than or equal to the specific number.

Figure 2:
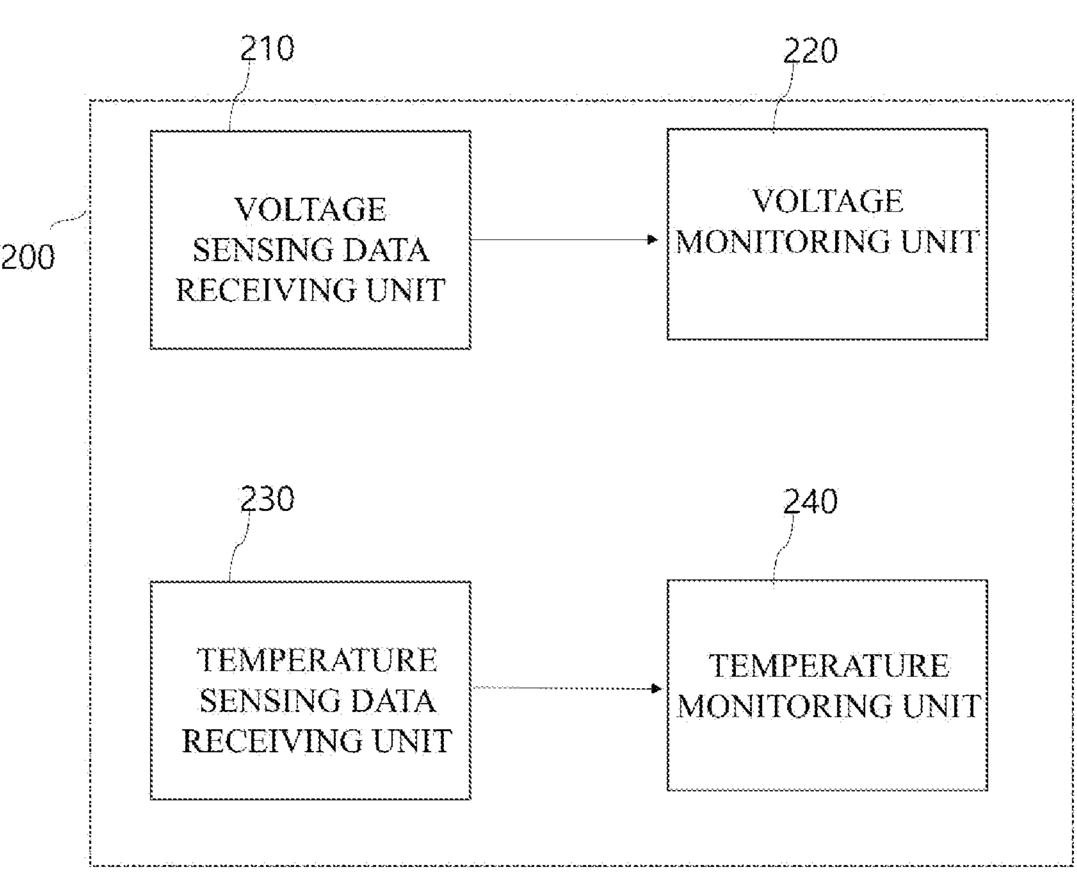
FIG. 2 is a block diagram for describing an internal structure of a master unit according to an embodiment of the present invention.

FIG. 2 is a block diagram for describing an internal structure of a master unit according to an embodiment of the present invention.

Referring to FIG. 2, the master unit 200 includes a voltage sensing data receiving unit 210, a voltage monitoring unit 220, a temperature sensing data receiving unit 230, and a temperature monitoring unit 240.

The voltage sensing data receiving unit 210 receives the voltage sensing data sensed by each of the plurality of slave units 100_1 to 100_N received from the last slave unit 100_N.

The voltage monitoring unit 220 compares the voltage and the preset threshold voltage range using the voltage sensing data sensed by each of the plurality of slave units 100_1 to 100_N received through the voltage sensing data receiving unit 210, generates the voltage balancing control signal according to the comparison result, and provides the generated voltage balancing control signal to each of the plurality of slave units 100_1 to 100_N through the last slave unit 100_N.

In an embodiment, when the voltage sensed by each of the plurality of slave units 100_1 to 100_N received from the last slave unit 100_N is not within the preset threshold voltage range, the voltage monitoring unit 220 may generate the voltage balancing control signal that is transmitted to the slave that generates the corresponding voltage sensing data.

In addition, when the voltage monitoring unit 220 receives the voltage sensing data sensed by each of the plurality of slave units 100_1 to 100_N, the voltage monitoring unit 220 displays each piece of the voltage sensing data in the first graph.

The voltage monitoring unit 220 divides the first graph into specific units and then groups the first graph to generate the plurality of groups.

In an embodiment, the voltage monitoring unit 220 divides the first graph into specific units and then groups the first graph to generate the plurality of groups.

In another embodiment, the voltage monitoring unit 220 analyzes the first graph, and when a waveform exists, divides and groups the first graph into cycle units to generate the plurality of groups.

Thereafter, the voltage monitoring unit 220 compresses the voltage values of the corresponding groups for each of the plurality of groups.

In an embodiment, the voltage monitoring unit 220 divides the first graph into specific units and then groups the first graph to generate the plurality of groups, and averages the voltage values of the corresponding groups for each of the plurality of groups to calculate the average value.

In this case, the voltage monitoring unit 220 may divide the voltage values in the first graph into specific number units to generate the plurality of groups.

Thereafter, the voltage monitoring unit 220 compresses the voltage values of each of the plurality of groups and displays the compressed voltage values in the second graph, and then generates and provides the voltage balancing control signal according to whether a specific voltage value in the second graph corresponding to each group is within the preset threshold voltage range.

In an embodiment, the voltage monitoring unit 220 averages the voltage values of each of the plurality of groups and displays the calculated average value in the second graph at a location corresponding to the group. In this case, the second graph averages a specific number of voltage values in the corresponding groups for each group and then displays a voltage value corresponding to the average value.

As described above, the voltage monitoring unit 220 may average the voltage values of the corresponding groups for each of the plurality of groups, display the averaged voltage value in the second graph and then analyze the second graph to extract the largest slope value, and then determine whether the largest slope value is within the preset threshold voltage range.

In an embodiment, the voltage monitoring unit 220 may compare the slope values extracted from each group to calculate the slope difference value, merge the groups according to the slope difference value to extract only one slope value, and then determine whether the extracted slope value is within the preset threshold voltage range.

In the above embodiment, the voltage monitoring unit 220 may compare the slope values extracted from each of the first group and the second group to calculate the slope difference value, merge the first group and the second group when the slope difference value is less than or equal to the specific value, and then determine whether the larger slope value of the largest slope value extracted from the first group and the largest slope value extracted from the second group is within the preset threshold voltage range.

In the process of repeatedly executing the above process, when the number of merged groups exceeds the specific number, the merging is stopped. Therefore, the voltage monitoring unit 220 checks the number of currently merged groups before merging the first group and the second group, and when the number of merged groups is greater than or equal to the specific number, the voltage monitoring unit 220 does not perform the merging, but performs the merging when the number of merged groups is less than or equal to the specific number.

The temperature sensing data receiving unit 230 receives the temperature sensing data sensed by each of the plurality of slave units 100_1 to 100_N received from the last slave unit 100_N.

The temperature monitoring unit 240 compares the temperature and the preset threshold temperature range using the temperature sensing data received through the temperature sensing data receiving unit 230, and generates the cell charge/discharge blocking control signal according to the comparison result and provides the generated cell charge/discharge blocking control signal to each of the plurality of slave units 100_1 to 100_N through the last slave unit 100_N.

In an embodiment, when the temperature sensed by each of the plurality of slave units 100_1 to 100_N received from the last slave unit 100_N is not within the preset threshold temperature range, the temperature monitoring unit 240 may generate the cell charge/discharge blocking control signal that is transmitted to the slave that generates the corresponding temperature sensing data.

In addition, when the temperature monitoring unit 240 receives the temperature sensing data sensed by each of the plurality of slave units 100_1 to 100_N, the temperature monitoring unit 240 displays each piece of the temperature sensing data in the first graph.

The temperature monitoring unit 240 divides the first graph into specific units and then groups the first graph to generate the plurality of groups.

In an embodiment, the temperature monitoring unit 240 divides the first graph into specific units and then groups the first graph to generate the plurality of groups.

In another embodiment, the temperature monitoring unit 240 analyzes the first graph, and when the waveform exists, divides and groups the first graph into cycle units to generate the plurality of groups.

Thereafter, the temperature monitoring unit 240 compresses the temperature values of the corresponding groups for each of the plurality of groups.

In an embodiment, the temperature monitoring unit 240 divides the first graph into specific units and then groups the first graph to generate the plurality of groups, and averages the temperature values of the corresponding groups for each of the plurality of groups to calculate the average value.

In this case, the temperature monitoring unit 240 may divide the temperature values in the first graph into specific number units to generate the plurality of groups.

Thereafter, the temperature monitoring unit 240 compresses the temperature values of each of the plurality of groups and displays the compressed voltage values in the second graph, and then generates and provides the cell charge/discharge blocking control signal according to whether the specific voltage value in the second graph corresponding to each group is within the preset threshold voltage range.

In an embodiment, the temperature monitoring unit 240 averages the temperature values of each of the plurality of groups and displays the calculated average value in the second graph at a location corresponding to the group. In this case, the second graph averages a specific number of temperature values in the corresponding groups for each group and then displays the temperature value corresponding to the average value.

As described above, the temperature monitoring unit 240 may average the temperature values of the corresponding groups for each of the plurality of groups, display the averaged temperature value in the second graph and analyze the second graph to extract the largest slope value, and then determine whether the largest slope value is within the preset threshold voltage range.

In an embodiment, the temperature monitoring unit 240 may compare slope values extracted from each group to calculate the slope difference value, merge the groups according to the slope difference value to extract only one slope value, and then determine whether the extracted slope value is within the preset threshold voltage range.

In the above embodiment, the temperature monitoring unit 240 may compare the slope values extracted from each of the first group and the second group to calculate the slope difference value, merge the first group and the second group when the slope difference value is less than or equal to the specific value, and then determine whether the larger slope value of the largest slope value extracted from the first group and the largest slope value extracted from the second group is within the preset threshold temperature range.

In the process of repeatedly executing the above process, when the number of merged groups exceeds the specific number, the merging is stopped. Therefore, the temperature monitoring unit 240 checks the number of currently merged groups before merging the first group and the second group, and when the number of merged groups is greater than or equal to the specific number, the temperature monitoring unit 240 does not perform the merging, but performs the merging when the number of merged groups is less than or equal to the specific number.

Figure 3:
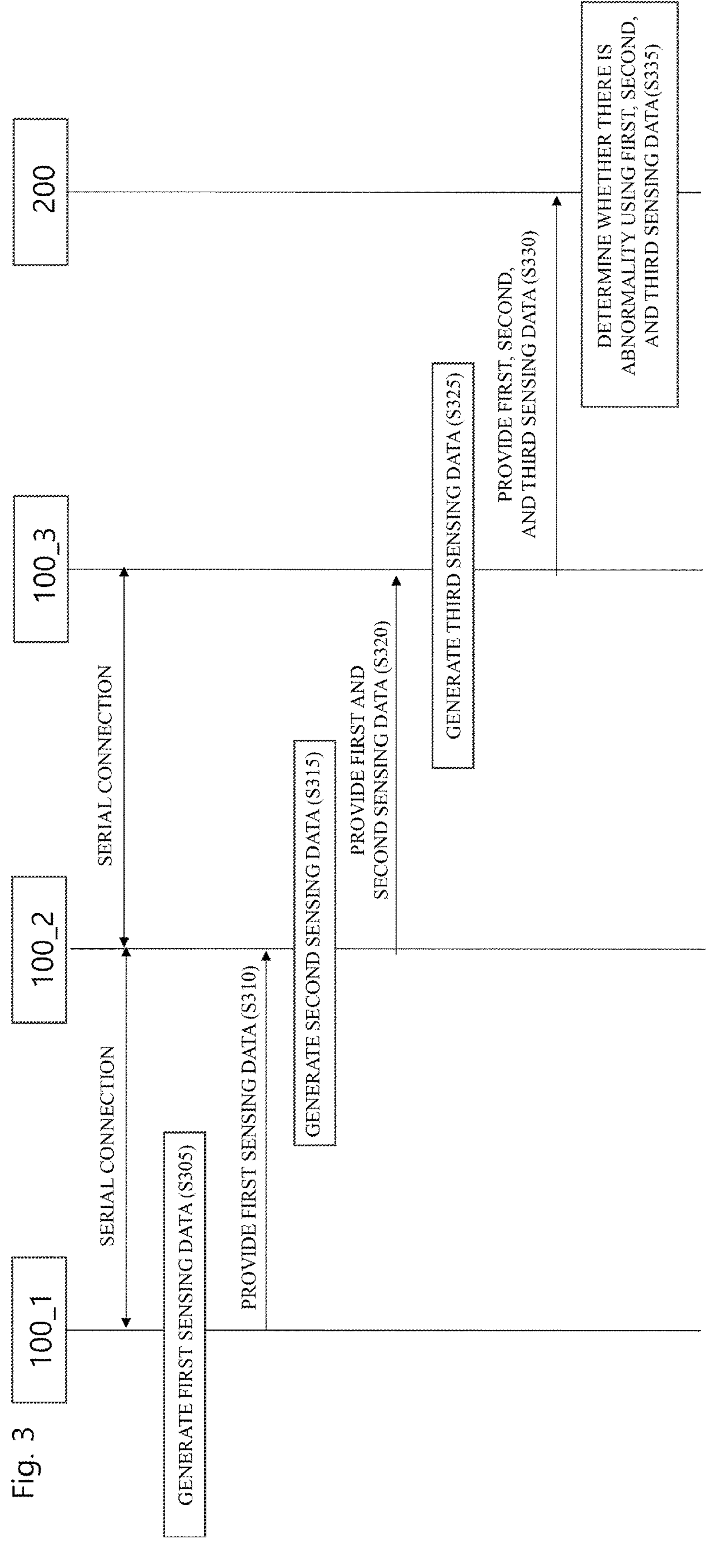
FIG. 3 is a diagram for describing a method of performing communication between a master and a slave in a supercap system according to an embodiment of the present invention.

FIG. 3 is a diagram for describing a method of performing communication between a master and a slave in a supercap system according to an embodiment of the present invention.

Referring to FIG. 3, the first slave unit 100_1 among the plurality of slave units 100_1 to 100_N connected in series generates first sensing data (operation S305) and then provides the first sensing data to the second slave unit 100_2 (operation S310).

The second slave unit 100_2 receives the first sensing data from the first slave unit 100_1, generates second sensing data (operation S315), and then provides the first sensing data and the second sensing data to the third slave unit 100_3 (operation S320).

When the third slave unit 100_3 is connected to the master unit, the third slave unit 100_3 generates third sensing data (operation S325), and then transmits the first sensing data, the second sensing data, and the third sensing data to the master unit (operation S330).

The master unit 200 monitors the battery using the first sensing data, the second sensing data, and the third sensing data from the third slave unit 100_3 (operation S335).

Figure 4:
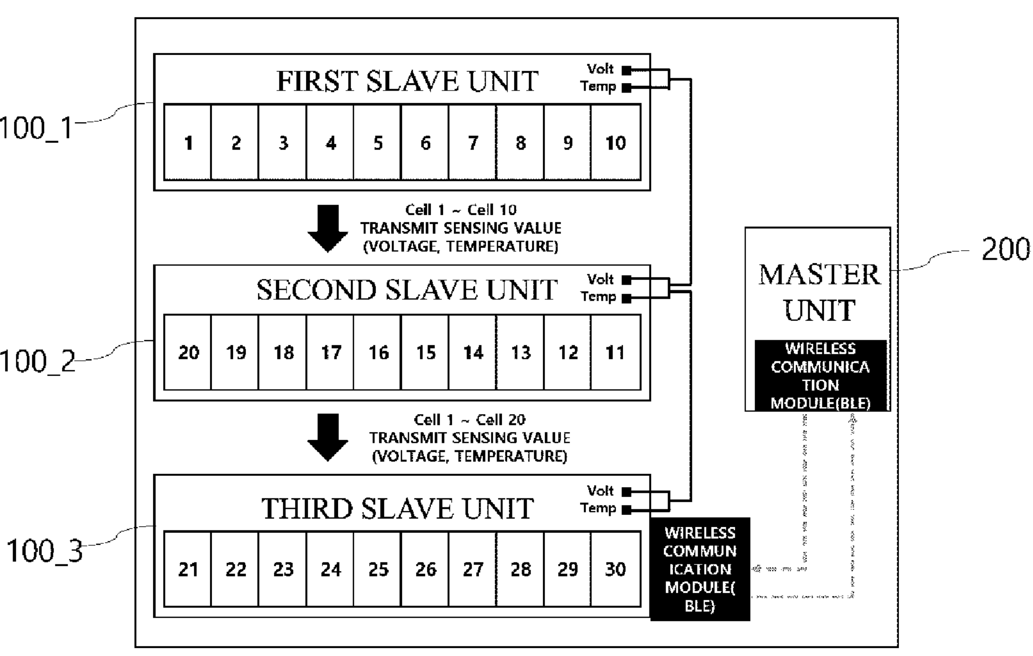
FIG. 4 is an exemplary diagram for describing a process of communication between a master and a slave in a supercap system according to an embodiment of the present invention.

FIG. 4 is an exemplary diagram for describing a process of communication between a master and a slave in a supercap system according to an embodiment of the present invention.

Referring to FIG. 4, the first to third slave units 100_1 to 100_3 are connected in series, and the third slave unit 100_3 communicates with the master unit 200.

First, the first slave unit 100_1 generates first voltage sensing data and second temperature sensing data for each cell Cell 1 to Cell 10 of the battery and provides the generated first voltage sensing data and second temperature sensing data to the second slave unit 100_2.

The second slave unit 100_2 generates second voltage sensing data and second temperature sensing data for each cell Cell 1 to Cell 20 of the battery, and provides the second voltage sensing data and the second temperature sensing data to the third slave unit 100_3 along with the first voltage sensing data and the second temperature sensing data received from the first slave unit 100_1.

The third slave unit 100_3 generates the second voltage sensing data and the second temperature sensing data for each cell Cell 21 to Cell 30 of the battery, and provides the first voltage sensing data, the second temperature sensing data, the second voltage sensing data, the second temperature sensing data, the third voltage sensing data, and the third temperature sensing data received from the second slave unit 100_2 to the master unit 200.

Accordingly, the master unit 200 may monitor the battery using the first sensing data, the second sensing data, and the third sensing data from the third slave unit 100_3.

As described above, according to the present invention, it is possible to allow a last slave unit connected to a master unit among a plurality of slave units connected in series to collect sensing data from the other slave units and transmit the collected sensing data to the master unit.

In addition, according to the present invention, it is possible to simplify a communication connection circuit between a master unit and a slave unit by connecting a plurality of slave units applied to a supercap system in series, thereby improving the problem of increased system weight due to an increase in the number of parts.

In addition, according to the present invention, it is possible to simplify a connection circuit and minimize the number of components by connecting a plurality of slave units applied to a supercap system in series and then connecting only a last slave unit to a master unit, thereby improving circuit connection stability.

Although the present invention has been described with reference to the limited embodiments and the accompanying drawings, it is not limited to the above-described embodiments but may be variously modified and changed from the above description by those skilled in the art to which the present invention pertains. Therefore, the scope and spirit of the present invention should be understood only from the following claims, and all of the equivalences and equivalent modifications to the claims are intended to fall within the scope and spirit of the present invention.

What is claimed is:

1. A system for communication between a master and a slave in a supercap system, comprising:

a plurality of slave units that are connected to each other in series to form a communication connection circuit, each slave unit generating sensing data comprising voltage sensing data and temperature sensing data, wherein the plurality of slave units include:

a first slave unit that generates first sensing data and transmits the first sensing data to another slave unit connected in series through the communication connection circuit; and at least one slave unit other than the first slave unit that receives sensing data generated by a preceding slave unit through the communication connection circuit and transmits the received sensing data together with sensing data generated by said at least one slave unit;

wherein a last slave unit among said at least one slave unit other than the first slave unit collects sensing data generated by all of the plurality of slave units and transmits the collected sensing data to a master unit through a first wireless communication module of the last slave unit; and the master unit comprising a second wireless communication module, the master unit communicating with the plurality of slave units only via the last slave unit through the second wireless communication module, wherein the master unit generates at least one control signal for controlling the plurality of slave units based on the collected sensing data and transmits said at least one control signal to the last slave unit.

2. The system of claim 1, wherein said at least one control signal comprises a voltage balancing control signal generated using the voltage sensing data of each of the plurality of slave units, and wherein the master unit transmits the voltage balancing control signal to each of the plurality of slave units connected in series through the last slave unit.

3. The system of claim 2, wherein the master unit divides the voltage sensing data into cycle units to generate a plurality of groups and compresses voltage values of each of the plurality of groups to generate representative voltage values, and generates the voltage balancing control signal based on the representative voltage values.

4. The system of claim 1, wherein said at least one control signal comprises a charge/discharge blocking control signal generated using the temperature sensing data transmitted to the master unit, and wherein the master unit transmits the charge/discharge blocking control signal to each of the plurality of slave units connected in series through the last slave unit.

5. The system of claim 4, wherein the master unit divides the temperature sensing data into cycle units to generate a plurality of groups and compresses temperature values of each of the plurality of groups to generate representative temperature values, and generates the charge/discharge blocking control signal based on the representative temperature values.

6. A method of performing communication between a master unit and a plurality of slave units in a supercap system, the plurality of slave units being connected to each other in series to form a communication connection circuit, the method comprising:

generating, by a first slave unit among the plurality of slave units, first sensing data, and transmitting the first sensing data to another slave unit through the communication connection circuit;

receiving, by other than the first slave unit, sensing data from a preceding slave unit through the communication connection circuit, generating sensing data of said at least one slave unit, and transmitting the received sensing data together with the generated sensing data through the communication connection circuit, collecting, by a last slave unit among said at least one slave unit other than the first slave unit, sensing data generated by all of the plurality of slave units;

transmitting, by the last slave unit through a first wireless communication module of the last slave unit, the collected sensing data to a master unit comprising a second wireless communication module;

generating, by the master unit, at least one control signal for controlling the plurality of slave units based on the collected sensing data and transmitting, by the master unit through the second wireless communication module, said at least one control signal to the last slave unit, wherein communication between the master unit and the plurality of slave units is performed only via the last slave unit.

7. The method of claim 6, wherein the generating of said at least one control signal comprises:

receiving, by the master unit, voltage sensing data of each of the plurality of slave units included in the collected sensing data from the last slave unit;

generating a voltage balancing control signal using the voltage sensing data of each of the plurality of slave units; and transmitting the voltage balancing control signal to each of the plurality of slave units connected in series through the last slave unit.

8. The method of claim 6, wherein the generating of said at least one control signal comprises:

receiving, by the master unit, temperature sensing data of each of the plurality of slave units included in the collected sensing data from the last slave unit;

generating a charge/discharge blocking control signal to block charging and discharging of a corresponding cell using the temperature sensing data of each of the plurality of slave units; and transmitting the charge/discharge blocking control signal to each of the plurality of slave units connected in series through the last slave unit.

* * * * *